United States Patent [19]

Compoly et al.

[11] 3,740,583

[45] June 19, 1973

[54] SILICON CONTROLLED RECTIFIER GATE DRIVE WITH BACK BIAS PROVISIONS

[75] Inventors: Albert W. Compoly, Belmar; Robert F. Kautz, Spring Lake, both of N.J.

[73] Assignee: The Bendix Corporation, Teterboro, N.J.

[22] Filed: May 25, 1971

[21] Appl. No.: 146,761

[52] U.S. Cl.......... 307/252 H, 307/202, 307/252 J, 307/264, 307/265, 307/284

[51] Int. Cl.... H03k 17/72, H03k 17/30, H03k 1/10

[58] Field of Search.................... 307/252 B, 252 C, 307/252 G, 252 H, 252 J, 252 N, 252 W, 202, 284, 305, 247 R, 264, 265, 270; 315/219, 221

[56] References Cited

UNITED STATES PATENTS

| | | | |
|---|---|---|---|
| 3,047,737 | 7/1962 | Kolodin | 307/247 R |
| 3,132,260 | 5/1964 | Gunderson et al. | 307/247 R |
| 3,480,797 | 11/1969 | Bedford et al. | 307/252 J |
| 3,335,294 | 8/1967 | Chauprade | 307/284 X |
| 3,487,231 | 12/1969 | Dixon, Jr. | 307/252 J |
| 3,248,634 | 4/1966 | Fudaley et al. | 307/291 X |
| 3,277,371 | 10/1966 | Marcus et al. | 307/252 C X |
| 3,343,005 | 9/1967 | Chauprade | 307/252 Q |
| 3,348,073 | 10/1967 | Oudard | 307/252 C |
| 3,353,032 | 11/1967 | Morgan et al. | 307/252 C |
| 3,509,376 | 11/1970 | Koetsch | 307/252 C |

*Primary Examiner*—John W. Huckert
*Assistant Examiner*—L. N. Anagnos
*Attorney*—S. H. Hartz and Plante, Hartz, Smith and Thompson

[57] ABSTRACT

A gating circuit for a silicon controlled rectifier for alternately providing a voltage drop across an impedance connected between the gate and the cathode of the SCR with the gate voltage more positive than the cathode voltage to permit the SCR to conduct and a voltage drop across the impedance with the cathode voltage more positive than the gate voltage to prevent the SCR from conducting.

11 Claims, 4 Drawing Figures

INVENTORS
ALBERT W. COMPOLY
ROBERT F. KAUTZ
BY
ATTORNEY

INVENTORS
ALBERT W. COMPOLY
ROBERT F. KAUTZ
BY
ATTORNEY

SILICON CONTROLLED RECTIFIER GATE DRIVE WITH BACK BIAS PROVISIONS

The invention relates to circuits including silicon controlled rectifiers (SCRs) and, more particularly to circuits for controlling conduction of SCRs.

Circuits as used heretofore for providing forward drive and back bias to the gates of SCRs were complex, bulky and heavy and were not suitable for airborne applications.

The present invention overcomes the inadequacies of SCR gating circuits as used heretofore in that the circuit is simple, small, lightweight, reliable and economical. A circuit constructed according to the invention provides a gate drive for a SCR which has steep wave fronts for causing the SCR to conduit quickly to prevent device degradation or failure. Also, during the period when the SCRs are nonconducting, the circuit provides reverse bias to the cathode gate junction.

The invention contemplates a gating circuit for a SCR, comprising a transformer having primary and secondary windings for isolating the SCR from the gating circuit, switching means for controlling energization of the primary winding by a voltage source, a logic circuit for controlling the switch means, a resistor connected between the gate and cathode of the SCR and to the secondary winding of the transformer, and means for alternately providing a voltage drop across the resistor with the gate voltage more positive than the cathode voltage to permit the SCR to conduct and a voltage drop across the resistor with the cathode voltage more positive than the gate voltage to prevent the SCR from conducting.

One object of the invention is to provide a gating circuit for controlling a SCR which is simple, small, lightweight and economical.

Another object is to provide a gate drive for a SCR with steep wave fronts for causing the SCR to conduct quickly to prevent device degradation or failure.

Another object is to provide reverse bias to the cathode gate junction of the SCR during the period when the SCR is nonconducting.

These and other objects of the invention are pointed out in the following description in terms of the embodiments thereof which are shown in the accompanying drawings. It is to be understood, however, that the drawings are for the purpose of illustration only and are not a definition of the limits of the invention, reference being had to the appended claims for this purpose.

Figure 1:
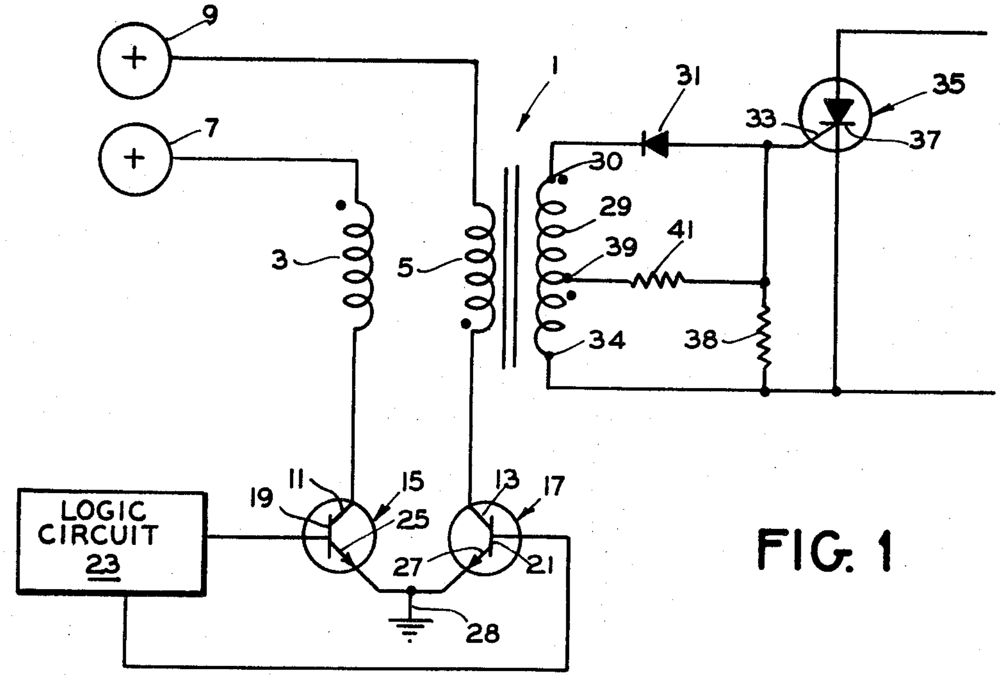
FIG. 1 is a schematic diagram of a circuit constructed according to the invention for providing gate voltages for controlling a SCR.

Referring to the drawings, in FIG. 1 is shown one embodiment of a novel circuit constructed according to the invention for providing gate voltages for controlling a SCR. A coupling transformer 1 having primary windings 3 and 5 are energized by voltage sources 7 and 9, respectively, and are connected to collectors 11 and 13 of transistors 15 and 17, respectively. Bases 19 and 21 of transistors 15 and 17 are connected to a logic circuit 23. Emitters 25, 27 of transistors 15 and 17 are connected to a common ground lead 28. Logic circuit 23 alternately renders transistors 15 and 17 conducting to alternately energize primary windings 3 and 5, respectively, of transformer 1 with square wave voltages.

A secondary winding 29 of transformer 1 has one terminal 30 connected through a diode 31 to gate 33 of a SCR 35 and the other terminal 34 connected to cathode 37 of SCR 35. A resistor 38 is connected between gate 33 and cathode 37 of SCR 35. A tap 39 between the ends of secondary winding 29 is connected through a current limiting resistor 41 to gate 33 of SCR 35. Resistor 38 suppresses noise and resistors 41 and 38 form a voltage divider.

Figure 4:
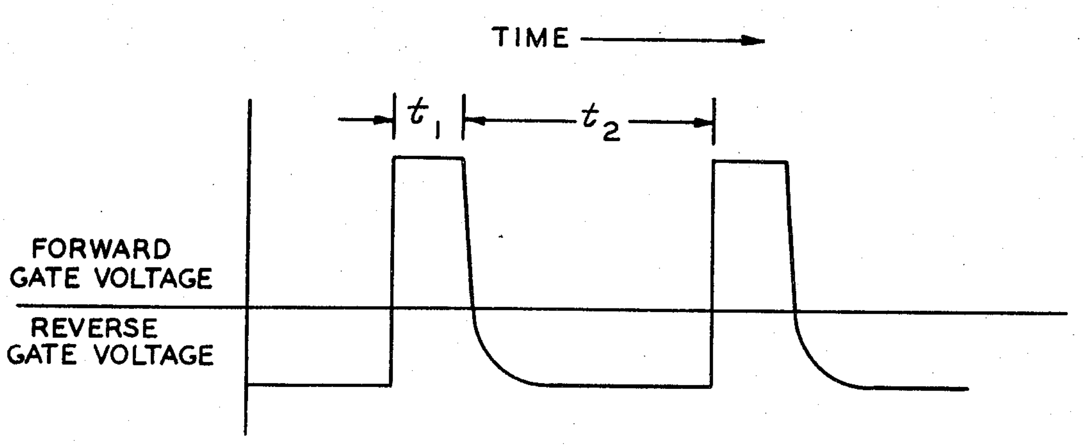
FIG. 4 is a representation of the voltages provided by the circuits.

The circuit described above provides a gate control voltage as shown in FIG. 4 in which $t_1$ is the ON time of the SCR and $t_2$ is the OFF time. In one application the ON time is selected as 2 milli-seconds and the OFF time is selected as 5 milli-seconds but the actual times selected may vary over a substantial range. The voltage during the ON time is positive and has a steep wave front and the voltage during the OFF time is negative and the voltage during the ON time is of greater amplitude than the voltage during the OFF time. Since the duty cycle of ON to OFF time of SCRs in most applications is unsymmetrical, primary windings 3 and 5 do not have equal turns and voltage source 9 may be lower than voltage source 7.

Coupling transformer 1 isolates SCR 35 from power sources 7 and 9 so that the gate drive may be provided by low level integrated logic circuits although many applications require that the SCR cathode be several hundred volts above ground potential. Transistors 15 and 17 are controlled by logic circuit 23 and provide for alternate energization of primary windings 3 and 5 by voltage sources 7 and 9 respectively to provide square wave voltages. The windings on transformer 1 are poled to provide a voltage at terminal 30 more positive than at terminal 34 when transistor 15 is switched on at time $t_1$. Current then flows from tap 39 through resistors 41 and 38 to terminal 34 and provides a positive forward voltage at gate 33 of SCR 35 because of the voltage drop across resistor 38. Terminal 30 of secondary winding 29 is positive, but current flow is prohibited by blocking diode 31 which is back biased because the voltage at terminal 30 is higher than the voltage at gate 33 of SCR 35.

At time $t_2$, transistor 15 is switched OFF and when SCR 35 has been commutated OFF by its main power circuit transistor 17 is switched ON by logic control circuit 23. The voltage across secondary winding 29 of transformer 1 is reversed so that terminal 34 is positive relative to terminal 30. Cathode 37 is at the potential of terminal 34. Current flows from terminal 34 through resistor 38 and diode 31 to terminal 30. Current may also flow from tap 39 through resistor 41 and diode 31 to terminal 30. Gate 33 of SCR 35 is at a lower potential than cathode 37 during time $t_2$ because of the voltage drop across resistor 38 and SCR 35 is back biased.

The back bias voltage shortens the turn off time of SCR 35 by sweeping out the charges stored in the junctions of the SCR due to prior forward conduction of the SCR. The forward voltage blocking capability of the SCR is greatly enhanced while the back bias voltage is present because no current from the anode can pass through the gate cathode junction of the SCR. The rate of change of reapplied voltage capability of most SCRs can be increased ten fold with this arrangement.

Figure 2:
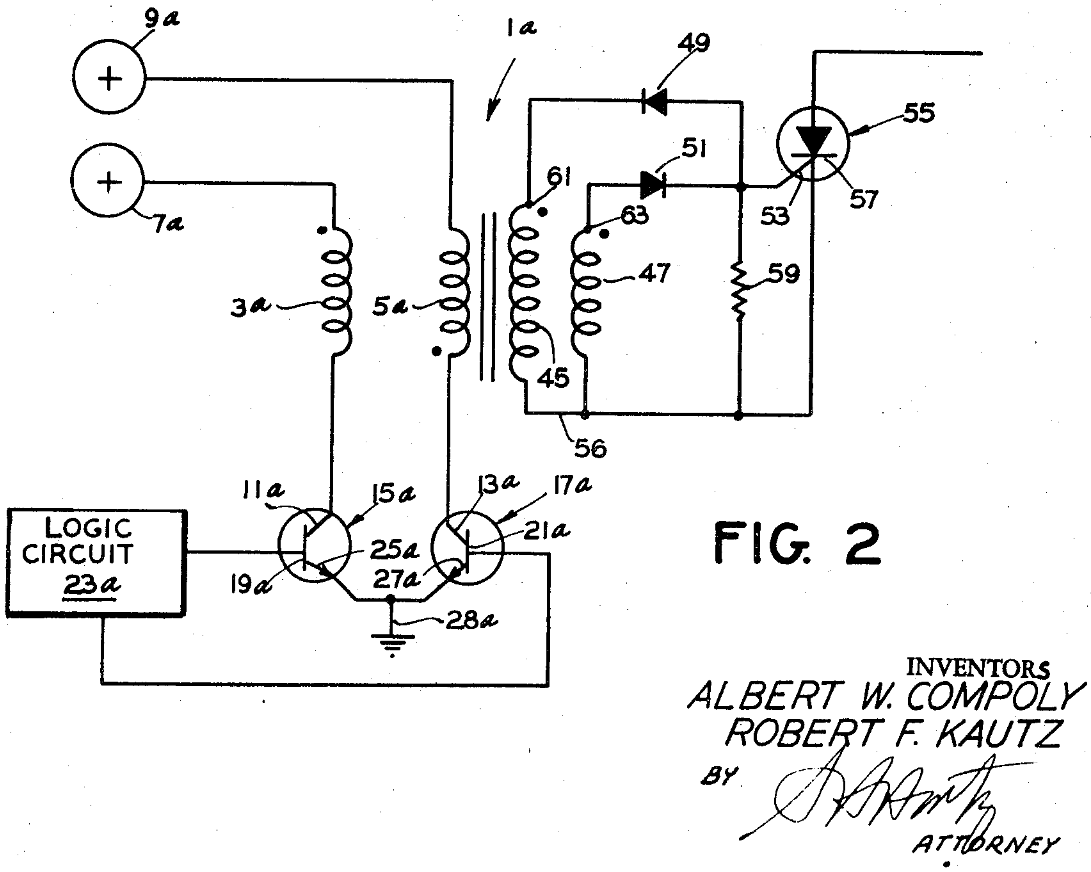
FIG. 2 is a schematic diagram showing a second embodiment of the invention.

A second embodiment of the invention shown in FIG. 2 uses the same control circuit as shown in FIG. 1 and the corresponding portions of the control circuit are numbered the same as in FIG. 1 except for the suffix *a* after the numbers. Transformer 1a has two secondary windings 45, 47 each connected at one end by oppositely poled diodes 49, 51 to gate 53 of SCR 55. The common junction 56 connecting the other ends of windings 45, 47 is connected to cathode 57 of SCR 55. A resistor 59 is connected between cathode 57 and gate 53 of SCR 55.

When primary winding 3*a* is energized in the manner described in connection with FIG. 1 during time $t_1$, terminal 61 of winding 45 and terminal 63 of winding 47 are positive with respect to common terminal 56. With this arrangement current flows from terminal 63 through diode 51 and resistor 59 to common terminal 56 so that gate 53 is positive relative to cathode 57 because of the voltage drop across resistor 57 and SCR 55 conducts. Terminal 61 of winding 45 is at a higher potential than gate 53 and diode 49 is back biased and no current flows through diode 49.

When winding 5a is energized during time $t_2$, common terminal 56 is positive with respect to terminal 61 of winding 45 and terminal 63 of winding 47. Current flows from common terminal 56 through resistor 59 and diode 49 to terminal 61 so that cathode 57 of SCR 55 is more positive than gate 53 because of the voltage drop across resistor 59 and SCR 55 does not conduct.

Figure 3:
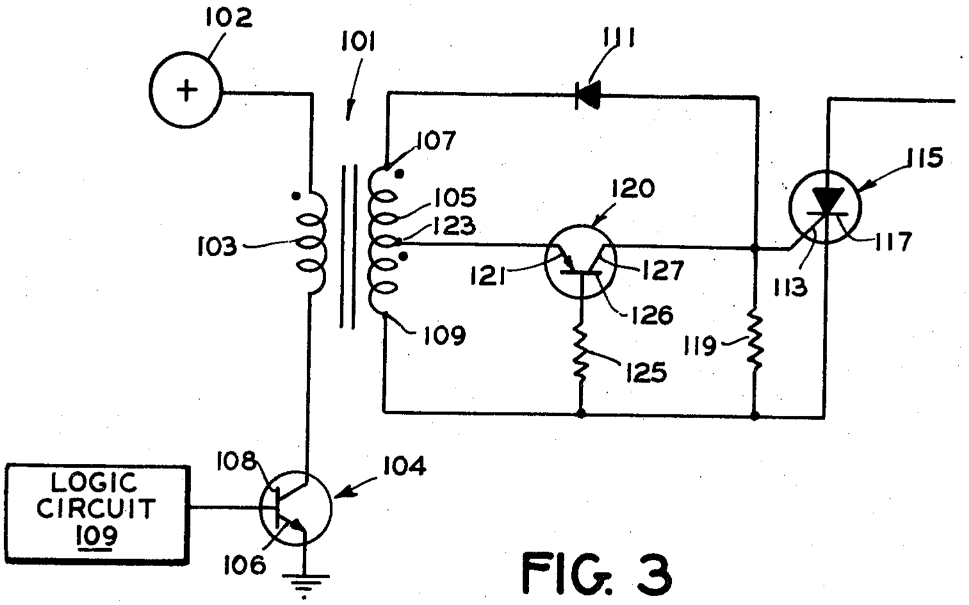
FIG. 3 is a schematic diagram showing a third embodiment of the invention.

A third embodiment of the invention shown in FIG. 3 requires only one voltage source and single primary and secondary windings to provide both forward and back bias gate voltages. Back bias voltage is produced by discharge of energy during period $t_2$ stored in the transformer core during period $t_1$. Since energy of the inductor is equal to ½ $LI^2$, where L is the inductance and I is the current, and the time constant of an inductor is equal to (L/R), where L is the inductance and R is the resistance of the circuit, knowing the time period $t_2$, the secondary winding of the transformer is designed to have a constant greater than $t_2$ insuring back bias for the SCR during its entire OFF time. This circuit is more efficient because no power is wasted in current limiting resistors in both the forward and reverse modes of operation.

In the embodiment of FIG. 3, a transformer 101 has a primary winding 103 connected to a relatively low voltage source 102. Current flow through the primary winding is controlled by a transistor 104 connected in series with the primary winding. Emitter 106 of transistor 104 is connected to ground and base 108 of transistor 104 is connected to a logic circuit 109 for controlling conduction of the transistor. When transistor 104 conducts current flows through primary winding 103 and energizes secondary winding 105 of transformer 101 so that terminal 107 and tap 123 are positive relative to terminal 109. Terminal 107 of transformer 105 is connected through a diode 111 to gate 113 of SCR 115 and terminal 109 of transformer 105 is connected to cathode 117 of SCR 115. A resistor 119 is connected between cathode 117 and gate 113 of SCR 115. A transistor 120 has an emitter 121 connected to tap 123 of secondary winding 105 and a collector 127 connected to gate 113 of SCR 115. Base 126 of transistor 120 is connected through a resistor 125 to terminal 109 of secondary winding 105.

During period $t_1$ transistor 104 conducts and current flows through primary winding 103. Tap 123 of secondary winding 105 is positive with respect to terminal 109 and transistor 120 also conducts. Resistor 125 limits base current of transistor 120 to a small value to avoid loss of power. Current flows from tap 123 through transistor 120 and resistor 119 to terminal 109. Gate 113 of SCR 115 is more positive than cathode 117 because of the voltage drop across resistor 119 and SCR 115 conducts. The voltage at terminal 107 also is positive with respect to terminal 123 but diode 111 is backed biased and current flow is blocked.

During time $t_2$ transistor 104 is turned OFF and transformer 101 being an inductor reverses polarity of all the voltages on the transformer windings so that terminal 109 is positive relative to tap 123 and terminal 107. Transistor 120 is back biased and does not conduct. Current flows from terminal 109 through resistor 119 and diode 111 to terminal 107. A back bias voltage appears across resistor 119 to prevent conduction of SCR 115. Resistor 119 is selected to meet the requirements of (L/R) for satisfying the time period of $t_2$ and SCR 115. Transistor 120 while conducting provides a low impedance path during the ON time of the SCR and reduces power losses in the circuit.

A circuit constructed according to the invention is simple, small, lightweight, reliable and economical and provides gate drive for an SCR which has steep wave fronts for causing the SCR to conduct quickly to prevent device degradation or failure. Also, during the period when the SCR is nonconducting the circuit provides reverse bias to the cathode gate junction.

What is claimed is:

1. A gating circuit for a silicon controlled rectifier comprising:

a coupling transformer having primary winding means connected to a voltage source and secondary winding means, means for controlling energization of the transformer by the voltage source to energize the secondary winding means alternately in opposite polarities, an impedance connected between the gate and cathode of the silicon controlled rectifier, and means connected to the secondary winding means of the transformer and to said impedance for providing a voltage drop across said impedance with the gate voltage more positive than the cathode voltage to permit the silicon controlled rectifier to conduct when the secondary winding means is energized in one polarity and a voltage drop across said impedance with the cathode voltage more positive than the gate voltage to prevent the silicon controlled rectifier from conducting when the secondary winding means is energized in the opposite polarity, the gate voltages being present during the entire period of conduction and non-conduction of the SCR.

2. A gating circuit as described in claim 1 in which the impedance is a resistor.

3. A gating circuit for a silicon controlled rectifier as described in claim 1 in which:

the means for controlling energization of the transformer by the voltage source includes means for energizing the secondary winding means alternately in opposite polarities for different time periods but with substantially equal total energizes to provide for conduction of the silicon controlled rectifier for a lesser period than for non-conduction of the silicon controlled rectifier.

4. A gating circuit for a silicon controlled rectifier as described in claim 3 in which:

the means for controlling energization of the transformer by the voltage source includes means for providing a gate voltage more positive than the cathode voltage of greater amplitude than the cathode voltage more positive than the gate voltage.

5. A gating circuit for a silicon controlled rectifier as described in claim 1 in which;

the means for controlling energization of the transformer by the voltage source includes switching means connected to the primary winding of the transformer, and a logic circuit connected to the switching means for controlling the switching means.

6. A gating circuit for a silicon controlled rectifier comprising:

a coupling transformer having primary winding means connected to a voltage source and secondary windings means, means for controlling energization of the transformer by the voltage source, a resistor connected between the gate and cathode of the silicon controlled rectifier, and means connected to the secondary winding means of the transformer and to said resistor for alternately providing a voltage drop across said resistor with the gate voltage more positive than the cathode voltage to permit the silicon controlled rectifier to conduct and a voltage drop across said resistor with the cathode voltage more positive than the gate voltage to prevent the silicon controlled rectifier from conducting, the last mentioned means including a diode connected in series with the resistors across the secondary winding, and means to provide a voltage drop across the resistor with the cathode voltage more positive than the gate voltage to prevent the silicon controlled rectifier from conducting.

7. A gating circuit for a silicon controlled rectifier as described in claim 6 which:

includes a tap on the secondary winding means between its ends, and said last mentioned means further includes a second resistor connected to the tap in series with the first mentioned resistor across a portion of the secondary winding to provide a voltage drop across said first mentioned resistor with the gate voltage more positive than the cathode voltage to permit the silicon controlled rectifier to conduct.

8. A gating circuit for a silicon controlled rectifier comprising:

a coupling transformer having two primary windings connected to D.C. voltage sources of different potentials and secondary windings means, means for controlling energization of the transformer by the voltage source including switching means to provide for alternate energization of the primary windings, an impedance connected between the gate and cathode of the silicon controlled rectifier, and means connected to the secondary winding means of the transformer and to said impedance for alternately providing a voltage drop across said impedance with the gate voltage more positive than the cathode voltage to permit the silicon controlled rectifier to conduct and a voltage drop across said impedance with the cathode voltage more positive than the gate voltage to prevent the silicon controlled rectifier from conducting.

9. A gating circuit for a silicon controlled rectifier comprising:

a coupling transformer having primary winding means connected to a voltage source and two secondary windings having a common junction at one end connected to the cathode of the silicon controlled rectifier, means for controlling energization of the transformer by the voltage source, an impedance connected between the gate and cathode of the silicon controlled rectifier, and a pair of oppositely poled diodes connected to the opposite ends of the secondary windings of the transformer and to the gate of the silicon controlled rectifier and to said impedance for alternately providing a voltage drop across said impedance with the gate voltage more positive than the cathode voltage to permit the silicon controlled rectifier to conduct and a voltage drop across said impedance with the cathode voltage more positive than the gate voltage to prevent the silicon controlled rectifier from conducting.

10. A gating circuit for a silicon controlled rectifier comprising:

a coupling transformer having primary winding means connected to a voltage source and secondary windings means with a tap between its ends, means for controlling energization of the transformer by the voltage source, an impedance connected between the gate and cathode of the silicon controlled rectifier, and switching means connected between the tap on the secondary winding means of the transformer and the gate of the silicon controlled rectifier and to said impedance for alternately providing a voltage drop across said impedance with the gate voltage more positive than the cathode voltage to permit the silicon controlled rectifier to conduct, and a diode connected to one end of the secondary winding means and to the gate of the silicon controlled rectifier and to the impedance to provide a voltage drop across said impedance with the cathode voltage more positive than the gate voltage to prevent the silicon controlled rectifier from conducting.

11. A gate circuit for a silicon controlled rectifier as described in claim 10 in which the switching means provides a low impedance path during the time the silicon controlled rectifier is conducting to reduce power losses in the circuit.

* * * * *